(12) United States Patent
Otey

(10) Patent No.: US 6,410,971 B1
(45) Date of Patent: Jun. 25, 2002

(54) THERMOELECTRIC MODULE WITH THIN FILM SUBSTRATES

(75) Inventor: Robert W. Otey, Litchfield, NH (US)

(73) Assignee: Ferrotec (USA) Corporation, Nashua, NH (US)

( * ) Notice: Subject to any disclaimer, the term of this patent is extended or adjusted under 35 U.S.C. 154(b) by 0 days.

(21) Appl. No.: 09/998,090

(22) Filed: Nov. 29, 2001

Related U.S. Application Data
(60) Provisional application No. 60/304,898, filed on Jul. 12, 2001.

(51) Int. Cl.$^7$ ............... H01L 31/058; H01L 23/38; H01L 27/16; H01L 35/00; H01L 25/28
(52) U.S. Cl. ............ 257/467; 257/530; 62/3.2; 62/3.7; 361/704; 438/54; 438/55
(58) Field of Search ............... 257/930, 467; 361/704; 62/3.2, 3.7; 438/54, 55

(56) References Cited
U.S. PATENT DOCUMENTS

| | | | |
|---|---|---|---|
| 4,935,864 A | 6/1990 | Schmidt et al. | |
| 5,168,339 A | 12/1992 | Yokotani et al. | |
| 5,362,983 A | 11/1994 | Yamamura et al. | |
| 5,430,322 A | 7/1995 | Koyanagi et al. | |
| 5,439,528 A | 8/1995 | Miller | |
| 5,515,238 A | * 5/1996 | Fritz et al. | 361/704 |
| 5,569,950 A | 10/1996 | Lewis et al. | |
| RE35,441 E | 2/1997 | Yokotani et al. | |
| 5,714,791 A | 2/1998 | Chi et al. | |
| 5,952,728 A | 9/1999 | Imanishi et al. | |
| 5,955,772 A | 9/1999 | Shakouri et al. | |
| 5,959,341 A | * 9/1999 | Tsuno et al. | 257/467 |
| 5,982,013 A | 11/1999 | Kishi et al. | |
| 5,982,014 A | 11/1999 | Paige | |
| 6,025,554 A | * 2/2000 | Macris | 136/205 |
| 6,034,408 A | 3/2000 | Shoshal | |
| 6,043,982 A | * 3/2000 | Meissner | 361/704 |
| 6,097,088 A | 8/2000 | Sakuragi | |
| 6,107,645 A | 8/2000 | Hidaka | |
| 6,222,243 B1 | 4/2001 | Kishi et al. | |

FOREIGN PATENT DOCUMENTS

| | | |
|---|---|---|
| JP | 6-090030 | 3/1994 |
| JP | 7-202275 | 8/1995 |

* cited by examiner

Primary Examiner—Ngân V. Ngô
(74) Attorney, Agent, or Firm—Robert R. Deleault, Esq.; Mesmer & Deleault, PLLC

(57) ABSTRACT

A flexible thermoelectric module having a pair of flexible substrates, a plurality of electrically conductive contacts on one side of each of the flexible substrates, and a plurality of P-type and N-type thermoelectric elements electrically connected between opposing sides of the pair of flexible substrates having the plurality of conductive contacts where the plurality of conductive contacts connect adjacent P-type and N-type elements to each other in series and where each of the P-type and N-type elements has a first end connected to one of the plurality of conductive contacts of one of the substrates and a second end connected to one of the plurality of electrical contacts of the other of the substrates.

38 Claims, 2 Drawing Sheets

THERMOELECTRIC MODULE WITH THIN FILM SUBSTRATES

This application claims the benefit of U.S. Provisional Patent Application No. 60/304,898, filed Jul. 12, 2001.

BACKGROUND OF THE INVENTION

1. Field of the Invention

The present invention relates generally to thermoelectric devices. Particularly, the present invention relates to thermoelectric devices and a method of fabricating the same.

2. Description of the Prior Art

Many types of industrial equipment require cooling or heating during their operation. Typical examples include semiconductor process equipment, pharmaceutical and biotechnology fermentation/separation vats, machine tools, air conditioners, plastic molding/extrusion equipment, analytical equipment, welding equipment, lasers, etc. One common way to provide the required cooling or heating is with a re-circulating coolant temperature control unit or chiller. A typical chiller consists of a Freon-based refrigeration loop connected to a recirculating coolant loop via a heat exchanger. However, as the world community becomes increasingly concerned about ozone depletion and global warming, a replacement for the standard Freon-based refrigeration technology is needed. Thermoelectric technology offers a clean, environmentally friendly, solid state alternative.

Thermoelectric cooling was first discovered by Jean-Charles-Athanase Peltier in 1834, when he observed that a current flowing through a junction between two dissimilar conductors induced heating or cooling at the junction, depending on the direction of current flow. This is called the Peltier effect. Practical use of thermoelectrics did not occur until the early 1960s with the development of semiconductor thermocouple materials, which were found to produce the strongest thermoelectric effect. Most thermoelectric materials today comprise a crystalline alloy of bismuth, tellurium, selenium, and antimony.

Thermoelectric devices are solid-state devices that serve as heat pumps. They follow the laws of thermodynamics in the same manner as mechanical heat pumps, refrigerators, or any other apparatus used to transfer heat energy. The principal difference is that thermoelectric devices function with solid state electrical components as compared to more traditional mechanical/fluid heating and cooling components.

The circuit for a simple thermoelectric device generally includes two dissimilar materials such as N-type and P-type thermoelectric semiconductor elements. The thermoelectric elements are typically arranged in an alternating N-type element and P-type element configuration. In many thermoelectric devices, semiconductor materials with dissimilar characteristics are connected electrically in series and thermally in parallel. The Peltier effect occurs when the voltage is applied to the N-type elements and the P-type elements resulting in current flow through the serial electrical connection and heat transfer across the N-type and P-type elements in the parallel thermal connection.

Typical construction of a thermoelectric module consists of electrically connecting a matrix of thermoelectric elements (dice) between a pair of electrically insulating substrates. The operation of the device creates both a hot-side substrate and a cool-side substrate. The module is typically placed between a load and a sink such as liquid plates, surface plates, or convection heat sinks. The most common type of thermoelectric element is composed of a bismuth-tellurium ($Bi_2Te_3$) alloy. The most common type of substrate is alumina (96%). These typically range in thickness from about 0.010 inches (0.25 mm) to about 0.040 inches (1.0 mm). A description of conventional thermoelectric modules and technology is also provided in the *CRC Handbook of Thermoelectrics and Thermoelectric Refrigeration* by H. J. Goldsmid.

A typical thermoelectric device requires DC power in order to produce a net current flow through the thermoelectric elements in one direction. The direction of the current flow determines the direction of heat transfer across the thermoelectric elements. The direction of net, non-zero current flow through the thermoelectric elements determines the function of the thermoelectric device as either a cooler or heater.

U.S. Pat. No. 6,222,243 (2001, Kishi et al.) discloses a thermoelectric device comprising a pair of substrates each having a surface, P-type and N-type thermoelectric material chips interposed between the pair of substrates, electrodes disposed on the surface of each substrate and connecting adjacent P-type and N-type thermoelectric material chips to each other, and support elements disposed over the surface of each of the substrates for supporting and aligning the thermoelectric material chips on the respective electrodes between the pair of substrates. Each of the thermoelectric material chips has a first distal end connected to one of the electrodes of one of the substrates and a second distal end connected to one of the electrodes of the other of the substrates. The adjacent P-type and N-type thermoelectric material chips connected by the electrodes are interposed between the pair of substrates such that a line connecting centers of the adjacent P-type and N-type thermoelectric material chips is coincident with a diagonal of each of the adjacent P-type and N-type thermoelectric material chips. The substrate used in the Kishi et al. device is a silicon wafer. A disadvantage of using silicon wafers as a substrate is the brittleness of the wafer and the thermal stresses that occur at the junction of the substrate and the thermoelectric material chips.

U.S. Pat. No. 5,362,983 (1994, Yamamura et al.) discloses a thermoelectric conversion module with series connection. The thermoelectric conversion module is constituted by either rows of thermoelectric semiconductor chips or columns of thermoelectric semiconductor chips of the same type. This arrangement improves assembling workability as well as preventing erroneous arrangement. The substrate used in the Yamamura et al. device is a ceramic substrate. A disadvantage of using a ceramic substrate is the brittleness of the ceramic and the thermal stresses that occur at the junction of the substrate and the thermoelectric semiconductor chips.

Other disadvantages of current thermoelectric module technology require that the substrates be thick enough to withstand cracking. The thicker the module, the heavier the thermoelectric module becomes. Also material costs for the thicker substrates are higher. In addition, the use of silicon or ceramic substrates limits the size and shape of thermoelectric modules. For instance, should spacing requirements determine that a normal 0.025 inch (0.64 mm) boundary between the edge of a pad and the edge of the module is too large, a special abrasive process must be used to reduce the boundary. Due to its brittleness, this may lead to chipping of the ceramic substrate.

Also, the rigidity of the ceramic substrate and the thermal cycling of a thermoelectric module where the heating side of the module is trying to expand while the cooling side of the module is trying to contract cause a "Potato Chip Effect." This Effect puts stresses on the thermoelectric chips and results in the eventual failure at the junctures between different mediums. These stresses increase as the module size increases. Furthermore, current thermoelectric module technology limits the available applications where these devices can be used. For instance, current thermoelectric module technology is not practical in applications having irregular and non-flat surfaces.

Therefore, what is needed is a thermoelectric module that is thinner than currently available thermoelectric modules. What is also needed is a thermoelectric module that can be used in applications having irregular and non-flat surfaces. What is further needed is a thermoelectric module that can be shaped and sized to fit the application.

SUMMARY OF THE INVENTION

It is an object of the present invention to provide a thermoelectric module that is thinner than currently available thermoelectric modules. It is another object of the present invention to provide a thermoelectric module that can be used in applications having irregular and non-flat surfaces. It is still another object of the present invention to provide a thermoelectric module that can be formed to odd shapes and to provide a way to make much larger devices than heretofore possible. It is yet another object of the present invention to provide a thermoelectric module with thin, flexible substrates.

The present invention achieves these and other objectives by providing a thermoelectric module with a flexible thin film substrate on one or both sides of the module. The thin film substrate provides the electrical connection between the P-type and N-type thermoelectric elements and the electrical isolation from the heat source or heat sink. The thin film substrate also functions as a heat transfer medium. A material for use as a thin film material is one that preferably has relatively good heat transfer, a broad operating temperature range, relatively high dielectric strength, and relatively high resistance to thermal cycling fatigue. An example of an acceptable material for use as a thin film material is polyimide. Other thin film materials with similar properties may also be used. An example of such a material is an epoxy-based film.

The thin flexible film is laminated or otherwise bonded to copper or other electrically conductive material. An example of ways to bond or laminate copper to the thin, flexible film include sputtering a conductive material onto the surface or using adhesives to bond the copper material to the surface. The electrically conductive material forms the electrical junction between the semiconductor elements of the module. The thin film material also provides electrical isolation between the electrical connections and the heat source or heat sink.

An external layer of thermally conductive material to enhance heat transfer between the thermoelectric module and a heat source or heat sink is typical but not necessary. The external layer is also laminated to or otherwise bonded to the opposite surface of the thin film substrate. The external, thermally conductive material may cover the entire outside surface of the thin film substrate, or it may mirror the electrical connection pads forming the junction between the semiconductor elements of the thermoelectric module.

DETAILED DESCRIPTION OF THE PREFERRED EMBODIMENT

Figure 1:
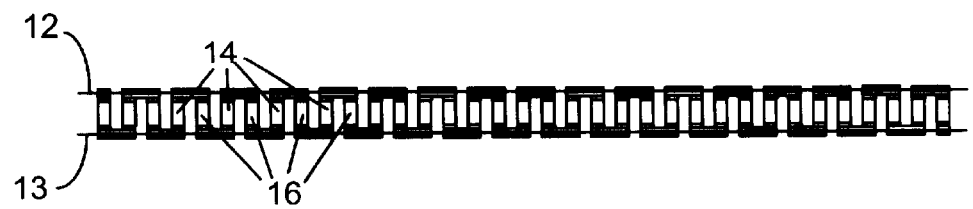
FIG. 1 is a cross-sectional view of the present invention showing the arrangement of the thermoelectric elements between flexible substrates.
Figure 2:
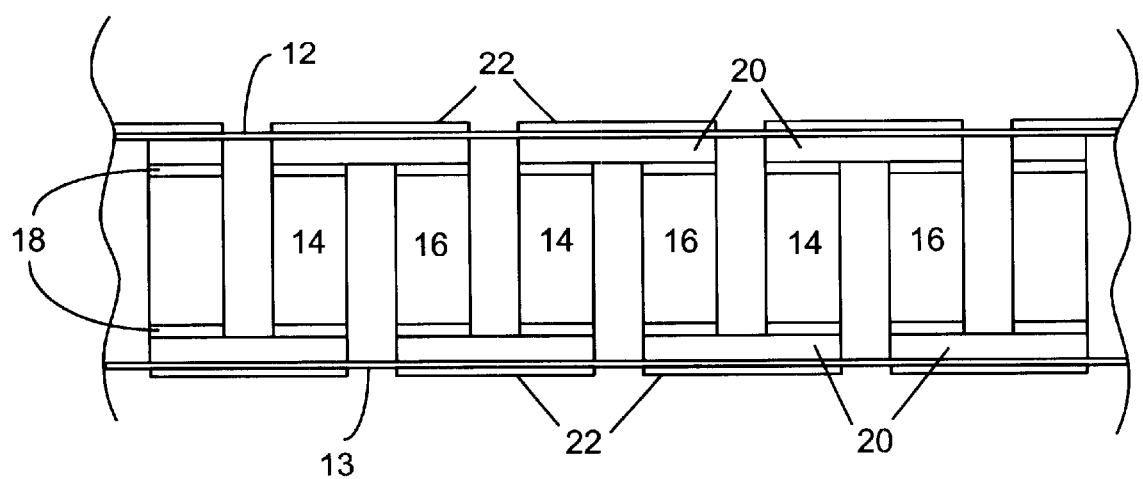
FIG. 2 is an enlarged, cross-sectional view of a portion of the present invention showing the different components of the thermoelectric module with flexible substrates.
Figure 3:
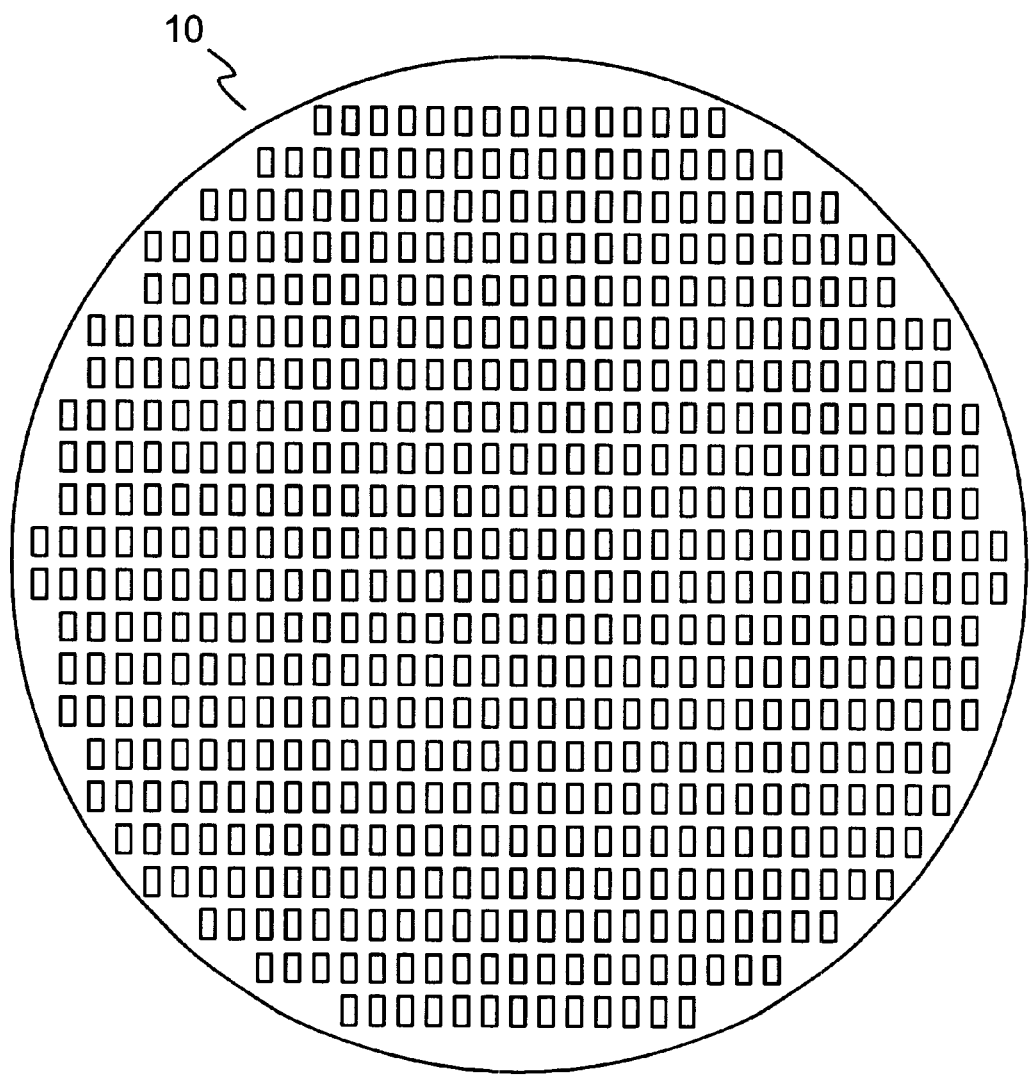
FIG. 3 is a top view of the present invention showing a large thermoelectric module using flexible substrates.

The preferred embodiment(s) of the present invention is illustrated in FIGS. 1–3. FIG. 1 is a side view of a thermoelectric device 10 according to the present invention. The basic structure of thermoelectric device 10 comprises P-type thermoelectric elements 14 and N-type thermoelectric elements 16 sandwiched between flexible substrates 12 and 13. P-type thermoelectric elements 14 and N-type thermoelectric elements 16 are electrically connected in series and thermally connected in parallel to provide the Peltier effect, which is the technological basis for a working thermoelectric module. It is noted that only one side of thermoelectric device 10 may use the thin, flexible substrate while the other side uses traditional substrates, i.e. ceramic (alumina) or silicon. When using only one thin, flexible substrate, it is preferable to use the flexible substrate on the hot side of the. thermoelectric module. The hot side tends to incur larger thermal stress due to the larger temperature difference that occurs during thermal cycling. The flexible substrate allows for expansion and contraction with much less restraint and stress because of its flexible nature.

Flexible substrates 12 and 13 are made of a flexible, thin film material. The thin film material provides electrical isolation from a heat source or heat sink while also functioning as a heat transfer medium. In particular, the material should have relatively high resistance to thermal cycling fatigue, relatively high dielectric strength, a broad operating temperature range, and relatively good heat transfer characteristics. The preferred material used in the present invention is a polyimide sheet material having a thickness of about 0.0005 inch (0.01 mm) to about 0.002 inch (0.051 mm). Other usable materials include thin-film epoxies and materials that meet the particular specifications required for a given application. Although the thickness of the flexible thin film material will enhance certain material characteristics at the expense of other material characteristics, the general criteria for selecting a preferred thickness for flexible substrates 12 and 13 is the material's tensile strength, its durability to withstand shear stress relative to the weight of the thermoelectric elements, its thermal conductivity, i.e. its ability to transfer heat, and its ability to withstand thermal stresses associated with thermal cycling of thermoelectric devices.

P-type thermoelectric elements 14 transfer heat in the direction of the current and N-type thermoelectric elements 16 transfer heat in the reverse direction of the current. By alternating P-type and N-type thermoelectric elements 14 and 16, hot and cold junctions are formed when electric current is provided to thermoelectric device 10. A heat exchanger (not shown) is thus configured so that heat may either be removed from, or added to, the heat exchanger by merely changing the direction of current flowing through thermoelectric device 10. Conversely, establishing a differential temperature across the thermoelectric device 10 will result in the generation of Direct Current at a level that is dependent on both the physical design of the module and the magnitude of the differential temperature. Thermoelectric materials most commonly used for making P-type thermoelectric elements 14 and N-type thermoelectric elements 16 are composed of a bismuth-tellurium alloy.

Turning now to FIG. 2, there is illustrated an enlarged side view of a selected portion of FIG. 1 to show the detail of thermoelectric device 10. Thermoelectric device 10 includes P-type and N-type thermoelectric elements 14 and 16, respectively, sandwiched between thin film, flexible substrates 12 and 13. Although a flexible substrate on each side of the P-type and N-type thermoelectric elements 14 and 16 is illustrated, a thermoelectric device 10 may have a flexible substrate on only one side, as previously discussed. Each distal end of P-type and N-type thermoelectric elements 14 and 16 are coated with a diffusion barrier 18. Diffusion barrier 18 prevents diffusion/migration of copper into P-type and N-type thermoelectric elements 14 and 16. Diffusion/migration of copper into the thermoelectric elements 14 and 16 shortens the working life of these components as thermoelectric elements, which may be acceptable in applications where the cost of the thermoelectric module is a determining factor. In these types of applications, diffusion barrier 18 is not required. Materials generally acceptable as diffusion barrier materials are nickel, or a titanium/tungsten mix, or molybdenum. The preferred material used in the present invention is nickel.

Flexible substrates 14 and 16 are coated with, laminated with, or otherwise bonded with a layer of an electrically conductive material, preferably copper, to form electrically conductive pads 20. The electrically conductive material may be formed over the entire surface of flexible substrates 12 and 13, which is then subsequently etched into the desired electrical connection pad pattern with the excess conductive material removed, or the desired connecting pad pattern may be coated, laminated or otherwise bonded to flexible substrates 12 and 13 in the desired configuration.

P-type and N-type thermoelectric elements 14 and 16 are preferably soldered to the electrically conductive pads in series forming a sandwiched matrix. Electrically conductive epoxy is another form of electrically conductive material that may also be used to form the desired conductive pads connecting the P-type and N-type thermoelectric elements 14 and 16 in series. On the opposite surface of flexible substrates 14 and 16, mirror-image pattern of pads 22 of the electrically conductive material pads 20 may be provided to enhance thermal conductivity between thermoelectric device 10 and a surface with which thermoelectric device 10 is in contact. Alternately, thermally conductive epoxy may be used to form the desired pads 22 on the outside surfaces of flexible substrates 12 and 13.

Although the diffusion barrier 18 was described as being applied to the distal ends of the P-type and N-type thermoelectric elements 14 and 16, it is noted that the diffusion barrier 18 may instead be applied to the conductive pads 20 on the flexible substrates 12 and 13.

FIG. 3 shows a reduced, top view of an example of a thermoelectric device 10 that is larger than previously practical with conventional module construction. FIG. 3 illustrates a thermoelectric device 10 having an eight (8) inch (20.32 cm) diameter and a module thickness of about 0.100 inch (2.54 mm).

A method of making a thermoelectric device 10 includes using a thin, flexible sheet material having an electrically conductive coating on both sides. Such substrate is available under the tradename/trademark GOULDFLEX available from Sheldahl, Inc., Northfield, Minn. The substrate generally has a copper coating on both sides with a coating thickness of about 0.0028 inch (0.071 mm). The desired pattern of electrically conductive pads is etched onto the substrate using known masking techniques. The copper of the conductive pad pattern is then pre-tinned to prepare the surface for soldering the dice (P-type elements 14 and N-type elements 16) thereto. Thermocouple semiconductor material ($Bi_2Te_3$ alloy) appropriate for forming P-type thermoelectric elements 14 and N-type thermoelectric elements 16 is cut to the desired size. The size of the P-type and N-type elements depends on the heat pump capacity needed for the thermoelectric device 10, which can be easily determined by those skilled in the art.

The ends of each P-type and N-type element are bonded with a diffusion barrier 18, preferably nickel. To reduce the cost of making a thermoelectric device 10, the diffusion barrier step may be eliminated. However, it should be understood that the useful life of the thermoelectric device 10 would be shortened because of copper migration into the P-type and N-type elements 14 and 16. The P-type and N-type thermoelectric elements 14 and 16 are then attached, preferably by soldering, to the pre-tinned, electrically conductive pads 20 of the flexible substrate 12 by manually picking and placing the P-type and N-type elements on the substrate, preferably using an alignment grid or screen, or by using an automated system that performs the placement and alignment and soldering, or by using a semi-automated pick and place system that solders the components. A second substrate 13 is attached to the opposite ends of the P-type and N-type elements in a similar manner. The second substrate 13 may also be a thin, flexible substrate or it may be the conventional ceramic substrate.

It was discovered that to obtain a flexible substrate thermoelectric device 10 having performance characteristics equal to or better than the performance characteristics of ceramic-based substrate thermoelectric modules, the electrically conductive material forming the conductive pads 20 must have a thickness greater than the thickness of conductive coatings currently available on flexible substrates. Current conductive coating thickness is capable of supporting 4 amp thermoelectric modules. The thickness of the electrically conductive material is dependent on the desired heat pump capacity of the thermoelectric device 10, the size of the thermoelectric device 10, and the size of the P-type and N-type thermoelectric elements used in the thermoelectric device 10. A thicker electrically conductive coating is desired to enable greater power densities, which results in greater heat pumping capacities for any given area. In general, design conductor cross-sections should be in accordance with those referenced in Mil Standard 275E.

However, the conductive layer thickness on currently available flexible substrates cannot be used to make thermoelectric modules capable of using 6 to 15 amps of current, which require a conductive layer thickness equal to or greater than 0.003 inch (0.076 mm) and typically in the range of 0.008 inch (0.20 mm) to 0.015 inch (0.38 mm). The preferred thickness is 0.012 inch (0.30 mm).

It was also discovered that producing a flexible substrate having the thicker conductive pads 20 for making a 6 amp to 15 amp thermoelectric module was a problem. Conventional wisdom by those skilled in the art of disposing conductive layers onto flexible substrates was that the thicker layers could not be done using current, state-of-the-art procedures. A variety of processes were developed to obtain a flexible substrate having the required characteristics for use in a flexible substrate thermoelectric module with current density ratings of 6 to 15 amps, depending on the application. Electrically insulating substrates with thicker conductive coatings are available from Ferrotec USA, Nashua, N.H.

Using flexible substrates 12 and 13, several advantages are obtained with the present invention over the prior art.

Relatively large thermoelectric modules can now be made that previously were impractical. The present invention provides the ability to make flexible thermoelectric modules that follow the contour of a shaped surface, thus making thermoelectric modules a viable alterative for applications that have irregular and/or non-flat surfaces. Use of a thin, flexible film substrate in a thermoelectric module reduces the overall weight of a thermoelectric module and reduces manufacturing costs. Because thermoelectric modules are generally used in applications that turn the thermoelectric module on and off, the use of a thin, flexible film substrate increases cycling life of the thermoelectric module. The flexibility of the substrate reduces the overall stresses caused by thermal cycling. In addition, the reduced thickness of a thermoelectric module made in accordance with the teachings of the present invention provides new application opportunities that were not practical for existing thermoelectric module technology. Also, the present invention provides one with the ability to create thermoelectric modules having odd shapes that was impractical using conventional module construction techniques.

Although the preferred embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:

1. A thermoelectric module comprising:
   a pair of substrates, wherein at least one of the substrates is a flexible substrate;
   a plurality of electrically conductive contacts disposed on opposing faces of said pair of substrates; and
   a plurality of P-type and N-type thermoelectric elements interposed between said pair of substrates, each of said plurality of conductive contacts connecting adjacent P-type and N-type thermoelectric elements to each other in series and wherein each of said P-type and N-type elements has a first end connected to one of said conductive contacts of one of said substrates and a second end connected to one of said conductive contacts of the other of said substrates.

2. The module of claim 1 further comprising a thermally conductive layer disposed on an outside surface of each of said pair of substrates.

3. The module of claim 2 wherein said thermally conductive layer has a thickness that allows the flexible substrate to remain flexible.

4. The module of claim 2 wherein said thermally conductive layer forms a plurality of thermally conductive contact points that spatially coincide with the areas covered by said plurality of conductive contacts on said opposing faces of said pair of substrates.

5. The module of claim 1 wherein said conductive contacts are thicker than said conductive layer.

6. The module of claim 5 wherein said conductive contacts have a thickness equal to or greater than 0.003 inch.

7. The module of claim 6 wherein said conduct contacts have a thickness of about 0.012 inch.

8. The module of claim 1 wherein said flexible substrate has a dielectric strength of about 500 V or more.

9. The module of claim 1 wherein said flexible substrate is selected from the group of materials consisting of polyimide and epoxy resin.

10. The module of claim 1 wherein said plurality of conductive contacts have a thickness sufficient to permit said module to operate using currents in the range of about 6 amps to about 15 amps.

11. The module of claim 2 wherein said flexible substrate has a thickness sufficient to provide electrical insulation between said plurality of conductive contacts and said conductive layer and to provide thermal conductivity between said plurality of P-type and N-type elements to said conductive layer.

12. The module of claim 11 wherein said flexible substrate has a thickness in the range of about 0.0005 inches to about 0.002 inches.

13. The module of claim 1 further comprising a diffusion barrier between said plurality of conductive contacts and said first and second ends of said plurality of said P-type and N-type elements.

14. The module of claim 13 wherein said diffusion barrier is made of a material selected from the group consisting of nickel, a titanium/tungsten mix, molybdenum, and other known diffusion barrier materials.

15. A thermoelectric module comprising:
    a pair of flexible substrates;
    a plurality of electrically conductive contacts disposed on opposing faces of said pair of flexible substrates, said conductive contacts having a thickness sufficient to permit said module to operate using currents in the range of about 6 amps to about 15 amps; and
    a plurality of P-type and N-type thermoelectric elements interposed between said pair of substrates, each of said plurality of conductive contacts connecting adjacent P-type and N-type thermoelectric elements to each other in series and wherein each of said P-type and N-type elements has a first end connected to one of said conductive contacts of one of said substrates and a second end connected to one of said conductive contacts of the other of said substrates.

16. The module of claim 15 further comprising a thermally conductive layer disposed on an outside surface of each of said pair of substrates.

17. The module of claim 16 wherein said conductive layer forms a plurality of thermally-conductive contact points that spatially coincide with the areas covered by said plurality of conductive contacts on said opposing faces of said pair of substrates.

18. The module of claim 16 wherein said conductive layer is thinner than said conductive contacts.

19. The module of claim 15 wherein said conductive contacts have a thickness equal to or greater than 0.003 inch.

20. The module of claim 19 wherein said conductive contacts have a thickness of about 0.012 inch.

21. The module of claim 15 wherein said flexible substrate has a dielectric strength of about 500 V or more.

22. The module of claim 15 wherein said flexible substrate is selected from the group of materials consisting of polyimide and epoxy resin.

23. The thermoelectric module of claim 16 wherein said thermally conductive layer has a thickness that permits said flexible substrate to remain flexible.

24. The thermoelectric module of claim 15 further comprising a diffusion barrier between said plurality of conductive contacts and said first and second ends of said plurality of P-type and N-type elements.

25. The thermoelectric module of claim 24 wherein said diffusion barrier is made of a material selected from the group consisting of nickel, a titanium/tungsten mix, molybdenum, and other known diffusion barrier materials.

26. The module of claim 15 wherein said flexible substrate has a thickness in the range of about 0.0005 inches to about 0.002 inches.

27. A method of making a flexible thermoelectric module comprising:

obtaining a pair of flexible substrates, each substrate having a plurality of electrical contacts disposed on one side; and electrically connecting a plurality of P-type and N-type thermoelectric elements between opposing sides having said plurality of electrical contacts of said pair of flexible substrates wherein each of said plurality of electrical contacts connects adjacent P-type and N-type elements to each other in series wherein each of said P-type and N-type elements has a first end connected to one of said plurality of electrical contacts of one of said substrates and a second end connected to one of said plurality of electrical contacts of the other of said substrates.

28. The method of claim 27 wherein said step of obtaining a pair of flexible substrates further includes a thermally conductive layer on the other side of said substrates.

29. The method of claim 28 wherein said method further including said thermally conductive layer on one side of said substrate shaped to have thermal contact points that coincide with the pattern of said plurality of electrical contacts on the other side of said substrate.

30. The method of claim 27 further comprising disposing a diffusion barrier between said electrical contacts and said first and second ends of said plurality of P-type and N-type elements.

31. A method of making a flexible thermoelectric module, said method comprising:

obtaining a pair of flexible substrates;

disposing an electrically conductive layer on at least one side of each of said pair of flexible substrates wherein said conductive layer thickness is equal to or greater than 0.003 inch;

etching said conductive layer of each of said pair of flexible substrates forming a plurality of electrical pads;

electrically connecting a plurality of P-type and N-type thermoelectric elements between opposing sides of said pair of flexible substrates having said plurality of electrical pads wherein each of said plurality of electrical pads connects adjacent P-type and N-type elements to each other in series wherein each of said P-type and N-type elements has a first end connected to one of said plurality of electrical pads of one of said substrates and a second end connected to one of said plurality of electrical pads of the other of said substrates.

32. The method of claim 31 further comprising disposing a thermally conductive layer on the other side of each of said pair of flexible substrates.

33. The method of claim 32 wherein said method further comprising etching said thermally conductive layer in a pattern to coincide with said plurality of electrical pads on the other side of said substrate.

34. The method of claim 31 further comprising disposing a diffusion barrier between said electrical pads and said first and second ends of said plurality of P-type and N-type elements.

35. A method of making a flexible thermoelectric module comprising:

obtaining a pair of flexible substrates, each substrate having a plurality of electrical contacts disposed on one side, said electrical contacts having a thickness capable of supporting current densities in the range of about 6 amps to about 15 amps; and electrically connecting a plurality of P-type and N-type thermoelectric elements between opposing sides having said plurality of electrical contacts of said pair of flexible substrates wherein each of said plurality of electrical contacts connects adjacent P-type and N-type elements to each other in series wherein each of said P-type and N-type elements has a first end connected to one of said plurality of electrical contacts of one of said substrates and a second end connected to one of said plurality of electrical contacts of the other of said substrates.

36. The method of claim 35 wherein said obtaining step includes obtaining substrates having a thermally conductive layer on the other side.

37. The method of claim 36 wherein said method further including said thermally conductive layer shaped to have thermal contact points in a pattern to coincide with said plurality of electrical pads on the other side of said substrate.

38. The method of claim 35 further comprising disposing a diffusion barrier between said electrical pads and said first and second ends of said plurality of P-type and N-type elements.

* * * * *

EX PARTE REEXAMINATION CERTIFICATE (6167th)

United States Patent
Otey

(10) Number: US 6,410,971 C1
(45) Certificate Issued: Apr. 1, 2008

(54) THERMOELECTRIC MODULE WITH THIN FILM SUBSTRATES

(75) Inventor: Robert W. Otey, Litchfield, NH (US)

(73) Assignee: Ferrotec (USA) Corporation, Nashua, NH (US)

Reexamination Request:
No. 90/007,882, Jan. 20, 2006

Reexamination Certificate for:
Patent No.: 6,410,971
Issued: Jun. 25, 2002
Appl. No.: 09/998,090
Filed: Nov. 29, 2001

Related U.S. Application Data

(60) Provisional application No. 60/304,898, filed on Jul. 12, 2001.

(51) Int. Cl.
*H01L 35/32* (2006.01)

(52) U.S. Cl. .................. 257/467; 257/530; 361/704; 438/54; 438/55; 62/3.2; 62/3.7

(58) Field of Classification Search ............ None
See application file for complete search history.

(56) References Cited

U.S. PATENT DOCUMENTS

| | | |
|---|---|---|
| 6,025,554 A | 2/2000 | Macris |
| 6,097,088 A | 8/2000 | Sakuragi |
| 6,274,803 B1 * | 8/2001 | Yoshioka et al. ........... 136/201 |
| 6,521,991 B1 | 2/2003 | Yamada et al. |

FOREIGN PATENT DOCUMENTS

| | | |
|---|---|---|
| JP | 7-7187 A | 1/1995 |
| JP | 7-202275 A | 8/1995 |
| JP | 8-293627 A | 11/1996 |
| JP | H8-293627 | 11/1998 |
| JP | H10-325561 | 12/1998 |
| JP | 10-325561 A | 12/1998 |
| JP | H2000-58930 A | 2/2000 |
| JP | H2000-214934 A | 8/2000 |

OTHER PUBLICATIONS

Japan, Dec. 15, 1978, Engrng Plastic Appln Hbk, p. 259.

* cited by examiner

*Primary Examiner*—Stephen Stein

(57) ABSTRACT

A flexible thermoelectric module having a pair of flexible substrates, a plurality of electrically conductive contacts on one side of each of the flexible substrates, and a plurality of P-type and N-type thermoelectric elements electrically connected between opposing sides of the pair of flexible substrates having the plurality of conductive contacts where the plurality of conductive contacts connect adjacent P-type and N-type elements to each other in series and where each of the P-type and N-type elements has a first end connected to one of the plurality of conductive contacts of one of the substrates and a second end connected to one of the plurality of electrical contacts of the other of the substrates.

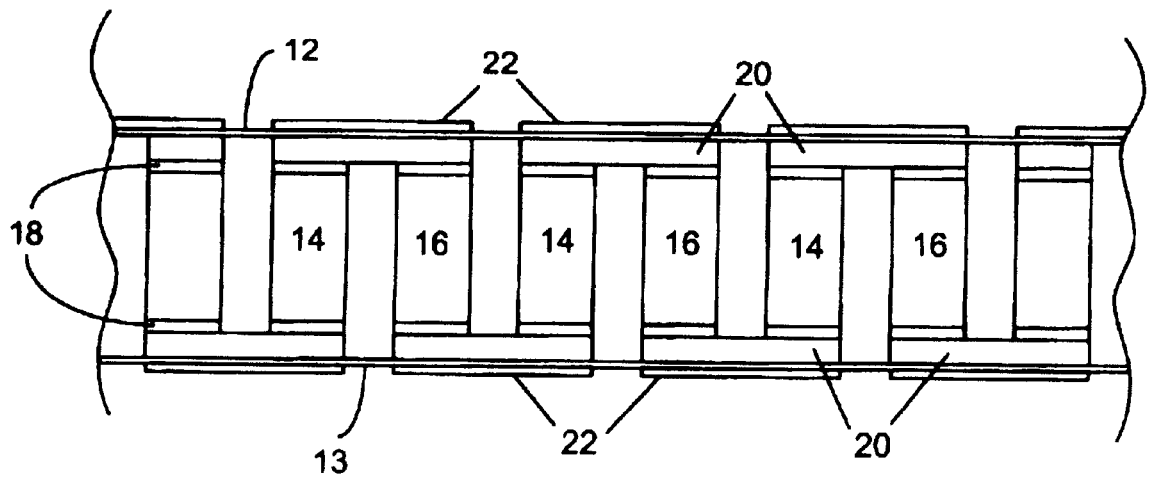

US 6,410,971 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 2, 13, 16, 24, 28, 32 and 36 are cancelled.

Claims 1, 3–5, 11, 14, 15, 17, 18, 23, 25, 27, 29, 31, 33, 35 and 37 are determined to be patentable as amended.

Claims 6–10, 12, 19–22, 26, 30, 34 and 38, dependent on an amended claim, are determined to be patentable.

1. A thermoelectric module [comprising] *consisting of*:
a pair of substrates *having a plurality of electrically conductive contacts disposed on opposing faces, wherein at least one of the substrates is a flexible substrate formed by disposing a plurality of electrically conductive contacts on one side and a thermally and electrically conductive layer on an opposite side*;
[a plurality of electrically conductive contacts disposed on opposing faces of said pair of substrates; and]
a plurality of P-type and N-type thermoelectric elements interposed between said pair of substrates, each of said plurality of conductive contacts connecting adjacent P-type and N-type thermoelectric elements to each other in series and wherein each of said P-type and N-type elements has a first end connected to one of said conductive contacts of one of said substrates and a second end connected to one of said conductive contacts of the other of said substrates*; and*
*a diffusion barrier between said plurality of conductive contacts and said first and second ends of said plurality of P-type and N-type elements.*

3. The module of claim [2] *1* wherein said thermally *and electrically* conductive layer has a thickness that allows the flexible substrate to remain flexible.

4. The module of claim [2] *1* wherein said thermally *and electrically* conductive layer forms a plurality of thermally *and electrically* conductive contact points that spatially coincide with the areas covered by said plurality of conductive contacts on said opposing faces of said pair of substrates.

5. The module of claim 1 wherein said conductive contacts are thicker than said *thermally and electrically* conductive layer.

11. The module of claim [2] *1* wherein said flexible substrate has a thickness sufficient to provide electrical insulation between said plurality of conductive contacts and said *thermally and electrically* conductive layer and to provide thermal conductivity between said plurality of P-type and N-type elements to said *thermally and electrically* conductive layer.

14. The module of claim [13] *1* wherein said diffusion barrier is made of a material selected from the group consisting of nickel, a titanium/tungsten mix, molybdenum, and other known diffusion barrier materials.

15. A thermoelectric module [comprising] *consisting of*:
a pair of flexible substrates *formed by disposing a plurality of electrically conductive contacts on opposing faces of each of said pair of flexible substrates and disposing a thermally and electrically conductive layer on an outside surface of each of said pair of flexible substrates wherein said plurality of conductive contacts have a thickness sufficient to permit said module to operate using currents in the range of about 6 amps to about 15 amps*;
[a plurality of electrically conductive contacts disposed on opposing faces of said pair of flexible substrates, said conductive contacts having a thickness sufficient to permit said module to operate using currents in the range of about 6 amps to about 15 amps; and]
a plurality of P-type and N-type thermoelectric elements interposed between said pair of substrates, each of said plurality of conductive contacts connecting adjacent P-type and N-type thermoelectric elements to each other in series and wherein each of said P-type and N-type elements has a first end connected to one of said conductive contacts of one of said substrates and a second end connected to one of said conductive contacts of the other of said substrates*; and*
*a diffusion barrier between said plurality of conductive contacts and said first and second ends of said plurality of P-type and N-type elements.*

17. The module of claim [16] *15* wherein said *thermally and electrically* conductive layer forms a plurality of [thermally-conductive] *thermally and electrically conductive* contact points that spatially coincide with the areas covered by said plurality of conductive contacts on said opposing faces of said pair of substrates.

18. The module of claim [16] *15* wherein said *thermally and electrically* conductive layer is thinner than said conductive contacts.

23. The thermoelectric module of claim [16] *15* wherein said thermally *and electrically* conductive layer has a thickness that permits said flexible substrate to remain flexible.

25. The thermoelectric module of claim[24] *15* wherein said diffusion barrier is made of a material selected from the group consisting of nickel, a titanium/tungsten mix, molybdenum, and other known diffusion barrier materials.

27. A method of making a flexible thermoelectric module comprising:
obtaining a pair of flexible substrates, each substrate having a plurality of electrical contacts disposed on one side *and a thermally and electrically conductive layer on the other side of said substrates*; and
electrically connecting a plurality of P-type and N-type thermoelectric elements between opposing sides *of said pair of flexible substrates* having said plurality of electrical contacts [of said pair of flexible substrates] wherein each of said plurality of electrical contacts connects adjacent P-type and N-type elements to each other in series wherein each of said P-type and N-type elements has a first end connected to one of said plurality of electrical contacts of one of said substrates and a second end connected to one of said plurality of electrical contacts of the other of said substrates.

29. The method of claim [28] *27* wherein said method further including *shaping* said thermally *and electrically* conductive layer on one side of said substrate [shaped] to have thermal contact points that coincide with the pattern of said plurality of electrical contacts on the other side of said substrate.

31. A method of making a flexible thermoelectric module, said method comprising:

obtaining a pair of flexible substrates, *each substrate having an electrically conductive layer disposed on one side wherein said conductive layer thickness is equal to or greater than 0.003 inch and a thermally and electrically conductive layer on the other side of each of said pair of flexible substrates*;

[disposing an electrically conductive layer on at least one side of each of said pair of flexible substrates wherein said conductive layer thickness is equal to or greater than 0.003 inch;]

etching said *electrically* conductive layer of each of said pair of flexible substrates forming a plurality of electrical pads; *and* electrically connecting a plurality of P-type and N-type thermoelectric elements between opposing sides of said pair of flexible substrates having said plurality of electrical pads wherein each of said pluralty of electrical pads connects adjacent P-type and N-type elements to each other in series wherein each of said P-type and N-type elements has a first end connected to one of said plurality of electrical pads of one of said substrates and a second end connected to one of said plurality of electrical pads of the other of said substrates.

33. The method of claim [32] *31* wherein said method further comprising etching said thermally *and electrically* conductive layer in a pattern to coincide with said plurality of electrical pads on the other side of said substrate.

35. A method of making a flexible thermoelectric module comprising:

obtaining a pair of flexible substrates, each substrate having a plurality of electrical contacts disposed on one side *and a thermally and electrically conductive layer on the other side*, said electrical contacts having a thickness capable of supporting current densities in the range of about6 amps to about 15 amps; and electrically connecting a plurality of P-type and N-type thermoelectric elements between opposing sides *of said pair of flexible substrates* having said plurality of electrical contacts [of said pair of flexible substrates] wherein each of said plurality of electrical contacts connects adjacent P-type and N-type elements to each other in series wherein each of said P-type and N-type elements has a first end connected to one of said plurality of electrical contacts of one of said substrates and a second end connected to one of said plurality of electrical contacts of the other of said substrates.

37. The method of claim [36] *35* wherein said method further including *shaping* said thermally *and electrically* conductive layer *shaped* to have thermal contact points in a pattern to coincide with said plurality of electrical pads on the other side of said substrate.

\* \* \* \* \*